(12) United States Patent
Mesuda et al.

(10) Patent No.: US 11,168,393 B2
(45) Date of Patent: Nov. 9, 2021

(54) GALLIUM NITRIDE SINTERED BODY OR GALLIUM NITRIDE MOLDED ARTICLE, AND METHOD FOR PRODUCING SAME

(71) Applicant: TOSOH CORPORATION, Yamaguchi (JP)

(72) Inventors: Masami Mesuda, Tokyo (JP); Keitaro Matsumaru, Kanagawa (JP); Koyata Takahashi, Kanagawa (JP); Ryou Kikuchi, Kanagawa (JP); Tetsuo Shibutami, Kanagawa (JP)

(73) Assignee: TOSOH CORPORATION, Yamaguchi (JP)

( * ) Notice: Subject to any disclaimer, the term of this patent is extended or adjusted under 35 U.S.C. 154(b) by 413 days.

(21) Appl. No.: 16/206,346

(22) Filed: Nov. 30, 2018

(65) Prior Publication Data

US 2019/0106784 A1  Apr. 11, 2019

Related U.S. Application Data

(62) Division of application No. 13/992,486, filed as application No. PCT/JP2011/079570 on Dec. 20, 2011, now Pat. No. 10,174,419.

(30) Foreign Application Priority Data

Dec. 20, 2010 (JP) ................ 2010-283165
Dec. 21, 2010 (JP) ................ 2010-284631

(51) Int. Cl.
| C23C 14/34 | (2006.01) |
| H01J 37/34 | (2006.01) |
| C04B 35/58 | (2006.01) |
| C04B 35/626 | (2006.01) |
| C04B 35/645 | (2006.01) |
| C04B 37/02 | (2006.01) |
| C04B 41/88 | (2006.01) |

(Continued)

(52) U.S. Cl.
CPC .......... *C23C 14/3414* (2013.01); *C04B 35/58* (2013.01); *C04B 35/6261* (2013.01);
(Continued)

(58) Field of Classification Search
None
See application file for complete search history.

(56) References Cited

U.S. PATENT DOCUMENTS 5,942,148 A    8/1999  Preston
2003/0086856 A1*  5/2003  D'Evelyn ............... B01J 3/062
                                                    423/409
(Continued)

FOREIGN PATENT DOCUMENTS

CN    101663413    3/2010
JP    01-301850    12/1989
(Continued)

OTHER PUBLICATIONS

Transactions of The Materials Research Society of Japan 29, 2004, pp. 2781-2784.
(Continued)

*Primary Examiner* — Jason Berman
(74) *Attorney, Agent, or Firm* — Greenblum & Bernstein, P.L.C.

(57) ABSTRACT

The present invention provides a gallium nitride sintered body and a gallium nitride molded article which have high density and low oxygen content without using a special apparatus. According to the first embodiment, a gallium nitride sintered body, which is characterized by having density of 2.5 g/cm³ to less than 5.0 g/cm³ and an intensity ratio of the gallium oxide peak of the (002) plane to the gallium nitride peak of the (002) plane of less than 3%, which is determined by X-ray diffraction analysis, can be obtained. According to the second embodiment, a metal gallium-impregnated gallium nitride molded article, which is characterized by comprising a gallium nitride phase and a
(Continued)

metal gallium phase that exist as separate phases and having a molar ratio, Ga/(Ga+N), of 55% to 80%, can be obtained.

11 Claims, 3 Drawing Sheets

(51) Int. Cl.
  *C04B 41/00* (2006.01)
  *C04B 41/51* (2006.01)
  *C22C 29/16* (2006.01)

(52) U.S. Cl.
  CPC ...... *C04B 35/62695* (2013.01); *C04B 35/645* (2013.01); *C04B 35/6455* (2013.01); *C04B 37/026* (2013.01); *C04B 41/009* (2013.01); *C04B 41/515* (2013.01); *C04B 41/88* (2013.01); *C22C 29/16* (2013.01); *H01J 37/3426* (2013.01); *H01J 37/3429* (2013.01); *C04B 2235/3286* (2013.01); *C04B 2235/465* (2013.01); *C04B 2235/5409* (2013.01); *C04B 2235/656* (2013.01); *C04B 2235/6562* (2013.01); *C04B 2235/6586* (2013.01); *C04B 2235/662* (2013.01); *C04B 2235/723* (2013.01); *C04B 2235/77* (2013.01); *C04B 2235/80* (2013.01); *C04B 2237/12* (2013.01); *C04B 2237/36* (2013.01); *C04B 2237/407* (2013.01); *Y10T 428/249921* (2015.04)

(56) References Cited

U.S. PATENT DOCUMENTS

| | | |
|---|---|---|
| 2007/0137999 A1 | 6/2007 | Delrue |
| 2009/0020768 A1* | 1/2009 | Butcher ............... H01L 23/535 257/88 |
| 2011/0155560 A1 | 6/2011 | Kuramochi et al. |
| 2012/0058883 A1 | 3/2012 | Yamashita et al. |
| 2012/0094823 A1 | 4/2012 | Watanabe et al. |
| 2013/0037763 A1 | 2/2013 | Tsukuma |
| 2013/0181173 A1 | 7/2013 | Kuramochi et al. |
| 2013/0214215 A1 | 8/2013 | Mesuda et al. |
| 2013/0217562 A1 | 8/2013 | Yamauchi et al. |

FOREIGN PATENT DOCUMENTS

| | | |
|---|---|---|
| JP | 2-228470 | 9/1990 |
| JP | 11-172424 | 6/1999 |
| JP | 2002-275557 | 9/2002 |
| JP | 2005-508822 | 4/2005 |
| WO | 03/041138 | 5/2003 |
| WO | 2008/102358 | 8/2008 |

OTHER PUBLICATIONS

U.S. Appl. No. 13/876,278 to Hideto Kuramochi et al., filed Mar. 27, 2013.
International Search Report dated Apr. 3, 2012 in PCT/JP2011/079570.
H.P. Hsieh, Inorganic Membranes for Separation and Reaction, Elsevier, 1996, 37, ISBN 0080534694, 9780080534695.

* cited by examiner

GALLIUM NITRIDE SINTERED BODY OR GALLIUM NITRIDE MOLDED ARTICLE, AND METHOD FOR PRODUCING SAME

The present application is a Divisional Application of U.S. application Ser. No. 13/992,486, filed on Jun. 7, 2013, which is a U.S. National Stage Application of International Patent Application No. PCT/JP2011/079570 filed on Dec. 20, 2011, which claims priority to Japanese Application No. 2010-284631 filed on Dec. 21, 2010 and Japanese Application No. 2010-283165 filed on Dec. 20, 2010. The disclosures of U.S. application Ser. No. 13/992,486 and International Patent Application No. PCT/JP2011/079570 are incorporated by reference herein in their entireties.

DESCRIPTION

Technical Field

The present invention relates to a gallium nitride sintered body, a gallium nitride molded article and methods of producing the same.

Background Art

Gallium nitride has been drawing attention as a luminescent layer of a blue light emitting diode (LED) and a material of a blue laser diode (LD). In recent years, gallium nitride has been used in the form of a thin film or a substrate in a variety of applications such as white LEDs and blue LDs and has also drawn attention as a prospective material to be used in applications such as power devices. At present a gallium nitride thin film is commonly produced by a metal organic chemical vapor deposition (MOCVD) method. In the MOCVD method, a vapor of a material is incorporated in a carrier gas and transported to the substrate surface where the material is decomposed by a reaction with the heated substrate to allow crystal growth.

Examples of a method of preparing a thin film other than the MOCVD method include a sputtering method. In a sputtering method, a cation such as Ar ion is physically collided with a target provided on cathode to allow the material constituting the target to be emitted by the collision energy to deposit a film having substantially the same composition as the target material onto a substrate provided on the opposite side. Examples of such sputtering method include direct-current sputtering method (DC sputtering method) and radio-frequency sputtering method (RF sputtering method).

Conventionally, a metal gallium target has been used in a method of preparing a gallium nitride thin film by sputtering (see, for example, Patent Document 1). However, in such cases where a metal gallium target is used, the target may be melted because the melting point of metal gallium is about 29.8° C.; therefore, it is necessary that an expensive cooling device is installed and the film formation is performed at a low power in order to prevent the target from melting, and there is a problem of reduced productivity.

Further, there has been proposed a gallium nitride thin film prepared by using a sputtering target containing gallium nitride as a main component (see, for example, Patent Document 2); however, the density and physical properties of such gallium nitride target have not been examined. In addition, a system in which Tb or the like is added has been prepared as a sputtering target; however, no examination has been made on a system consisting of only gallium nitride or nitrogen and gallium.

Moreover, there has been proposed a high-density sintered body of gallium nitride (see, for example, Patent Document 3). Such a sintered body is densified at a pressure of 58 Kbar (5.8 GPa); however, an apparatus required for applying such a pressure is very expensive and is, therefore, not suitable for preparing a large-sized sintered body.

PRIOR ART DOCUMENTS

Patent Documents

[Patent Document 1] Japanese Unexamined Patent Publication Hei No. 11-172424
[Patent Document 2] Japanese Unexamined Patent Publication Hei No. 01-301850
[Patent Document 3] Japanese Unexamined Patent Publication No. 2005-508822

NON-PATENT DOCUMENTS

[Non-patent Document 1] Transactions of The Materials Research Society of Japan 29[6], 2781-2784 (2004)

SUMMARY OF THE INVENTION

Problems to be Solved by the Invention

Gallium nitride which may be used as a sputtering target or the like has the following problems.

The first problem is that a large-scale apparatus is required for producing a high-density sintered body of gallium nitride. Gallium nitride is decomposed into gallium and nitride at about 1000° C. under normal pressure; therefore, sintering does not proceed. In addition, gallium nitride has a low diffusion coefficient and the density thereof is hardly improved by ordinary sintering even at about 1000° C. In view of this, a method for improving the density of a sintered body without requiring a large-scale apparatus has been investigated and, for example, a hot-pressing method has been employed (see, for example, Non-patent Document 1). However, the hot-pressing method can only yield a sintered body having density of about 48% (2.9 g/cm$^3$) in terms of relative density, which is considerably low as a sputtering target. Since such a low-density sintered body contains a large number of pores, the electrical discharge at the time of sputtering is not stable. In addition, since such a sintered body has low thermal conductivity and heat is trapped in the surface side at the time of sputtering, cracking is likely to occur.

The second problem is the oxygen content. When gallium nitride containing a large amount of oxygen is used as a sputtering target, a desired gallium nitride thin film cannot be obtained with good purity, since a large amount of oxygen is also incorporated into the resulting thin film. In cases where the density of a gallium nitride target is simply improved as in the case of Patent Document 2, only a sintered body containing a large amount of oxygen can be obtained, since a gallium nitride powder contains a certain amount of oxygen. Furthermore, when a compact sintered body is prepared, incorporation of an oxide into the interior of the sintered body makes it difficult to remove oxygen.

The third problem is the difficulty of attaining a high film formation rate. Since a non-doped gallium nitride target has high electrical resistance and thus hardly conducts electricity, only a radio-frequency (RF) sputtering method can be used and a direct-current (DC) sputtering method, which is capable of forming a film at a high rate, cannot be used.

An object of the present invention is to provide a gallium nitride sintered body and a gallium nitride molded article which can solve the above-described problems.

Means for Solving the Problems

A first embodiment of the present invention is directed to a gallium nitride sintered body which is characterized by having density of 2.5 g/cm³ to less than 5.0 g/cm³ and an intensity ratio of the gallium oxide peak of the (002) plane to the gallium nitride peak of the (002) plane of less than 3%, which is determined by a powder X-ray diffraction analysis.

The gallium nitride sintered body according to the first embodiment is characterized by having an intensity ratio of the gallium oxide peak of the (002) plane to the gallium nitride peak of the (002) plane, which is determined by a powder X-ray diffraction analysis, of less than 3%. The intensity ratio of the peaks can be determined by the powder X-ray diffraction analysis, based on the intensity ratio of the gallium nitride peak of the (002) plane and the gallium oxide peak of the (002) plane.

Conventionally, a gallium nitride sintered body may contain gallium oxide. When such a gallium oxide-containing sputtering target is used, it is difficult to obtain a gallium nitride thin film having excellent purity, since a large amount of oxygen is also incorporated into the resulting sputtered thin film.

There may be a method of reducing the amount of gallium oxide contained in a gallium nitride powder used as a starting material in order to reduce the amount of gallium oxide in a gallium nitride sintered body. However, an oxide phase such as gallium oxide may exist in such a gallium nitride powder as a material in such an amount that cannot be detected by a powder X-ray diffraction. When a gallium nitride sintered body is produced by sintering such a gallium nitride powder and measured by, for example, a powder X-ray diffraction, the resulting gallium nitride sintered body may contain a gallium oxide phase in such an amount that a gallium oxide peak can be detected. This is mainly attributable to that the surface layer of gallium nitride powder is easily oxidized. Further, even if a powder having a low oxygen content was prepared at the time of synthesizing a gallium nitride powder, it is difficult to maintain a low oxygen content in the process between the preparation of a gallium nitride powder and the preparation of a gallium nitride sintered body, since such a powder is likely to be affected by various ambient environments including storage and sintering conditions.

In view of the above, the present inventors intensively studied in order to obtain a gallium nitride sintered body having a low oxygen content and discovered that, as the first embodiment of the present invention, a gallium nitride sintered body in which the intensity ratio of the gallium oxide peak to the gallium nitride peak in the (002) plane, which is determined by X-ray diffraction analysis, is less than 3% can be obtained by heat-treating a gallium nitride sintered body in an ammonia-containing atmosphere, and thus nitriding portions in the gallium oxide state in the resulting sintered body. The intensity ratio of the gallium oxide peak to the gallium nitride peak in the (002) plane is also preferably not higher than 1%.

In the first embodiment, the gallium nitride sintered body has an oxygen content of preferably not higher than 11 atm %, more preferably not higher than 5 atm %. The oxygen content of the sintered body can be measured using an oxygen-nitrogen analyzer.

In this embodiment, the gallium nitride sintered body has density of 2.5 g/cm³ to less than 5.0 g/cm³, preferably 3.0 g/cm³ to 4.5 g/cm³. The term "density" of the gallium nitride sintered body refers to the density including open pores, and represents either a value calculated from the weight and the volume which is determined from the shape of the sintered body or a bulk density measured in accordance with JIS R1634 (Test methods for density and apparent porosity of fine ceramics). The gallium nitride sintered body is required to have a desired strength to be used as a sputtering target, and it is also preferred that the sintered body has density of not less than 2.5 g/cm³ in order to attain such a strength. It is also preferred that the gallium nitride sintered body has density of less than 5.0 g/cm³ in order to nitride the entire sintered body including the interior thereof by allowing an ammonia atmosphere to permeate into the pores inside the sintered body, at the time of subjecting the sintered body to a nitridation treatment in the ammonia atmosphere to reduce the amount of gallium oxide.

The pores existing in the interior of the gallium nitride sintered body are classified into closed pores and open pores. A closed pore is an isolated pore existing in the interior of the sintered body, while an open pore is a pore connected to the outer surface. The pores can be measured in accordance with JIS R1634 using the following formulas, wherein $\rho_1$ represents the density of measurement solvent; $W_1$ represents a dry weight; $W_2$ represents the weight-in-water; $W_3$ represents the water-saturated weight; and $\rho$ represents the true density of gallium nitride (6.087 g/cm³):

Open pore volume: $V_o = (W_3 - W_1)/\rho_1$

Closed pore volume: $V_c = (W_1 - W_2)/\rho_1 - W_1/\rho$

The ratio of open pores relative to all pores = $V_0/(V_0 + V_c)$

In the gallium nitride sintered body of this embodiment, it is preferable that not less than 70% by volume of the voids (pores) existing therein are open pores. This is because a greater number of open pores are more advantageous for achieving the reduction of the entire sintered body, since a reducing substance permeates through the open pores during the reduction treatment of the sintered body. More preferably, the ratio of the open pores (open porosity) is not less than 90% by volume.

A method of producing the gallium nitride sintered body according to the first embodiment is described hereinafter.

In this embodiment, as a result of detailed examination of the relationships between various physical properties of material powder, such as specific surface area (BET), untamped bulk density, and repose angle, and the strength of the resulting sintered body, it was discovered that incorporation of oxygen as an impurity can be reduced and a high-strength sintered body can be obtained, by controlling the above various physical properties of gallium nitride powder. The term "untamped bulk density" used herein refers to a value which is obtained by filling a container of a certain volume with a powder without applying any load such as vibration and dividing the weight of the filled powder by the volume of the container.

That is, in this embodiment, it is also preferred that the gallium nitride powder used as a starting material has a specific surface area (BET) of 0.4 m²/g to 15 m²/g. It is also preferred that the specific surface area (BET) is not higher than 15 m²/g in order to reduce incorporation of oxygen as an impurity to obtain a highly crystalline film by sputtering. It is also preferred that the specific surface area (BET) is not less than 0.4 m²/g in order to improve the sintering properties of the gallium nitride powder to obtain a sintered body having sufficient strength.

It is also preferred that the gallium nitride powder has untamped bulk density of not less than 0.4 g/cm³. It is also preferred that the untamped bulk density is not less than 0.4 g/cm³ in order to facilitate the sintering of the gallium nitride to obtain a sintered body having sufficient strength as a sputtering target.

It is also preferred that the gallium nitride powder has a repose angle of not larger than 40°. It is also preferred that the repose angle is not larger than 40° in order to facilitate the sintering of the gallium nitride sintered body to obtain a sintered body having sufficient strength as a sputtering target.

In this embodiment, it is also preferred that the gallium nitride powder to be used as a starting material contains impurities in the smallest amount possible in order to obtain a sputtering film having high crystallinity or attain a desired change in the semiconducting properties of the sputtering film by an addition of an element. Preferably, the gallium nitride powder is granulated.

Further, in this embodiment, a gallium nitride powder prepared by subjecting a gallium oxide powder to a nitridation treatment in an ammonia atmosphere at a temperature of 1000° C. to 1100° C. may also be employed as the gallium nitride powder used as a starting material. The gallium oxide powder can be sufficiently nitrided by setting the nitridation temperature at 1000° C. or higher. A gallium nitride powder having a desired specific surface area can be obtained by setting the nitridation temperature at not higher than 1100° C.

A variety of methods such as a pressureless sintering and a pressure sintering can be employed as the sintering method. An atmosphere which has a low oxygen concentration or contains no oxygen, such as a vacuum sintering atmosphere or an inert atmosphere, such as nitrogen and argon, can be employed as the sintering atmosphere in order to prevent oxidation of the gallium nitride. The sintering can be performed by a variety of sintering methods. Preferably, a hot-pressing (HP) method or a hot isostatic pressing (HIP) method is employed.

In the hot-pressing method, sintering of a powder sample is facilitated by applying heat thereto under an increased pressure, substance diffusion during sintering can be assisted by uniaxial pressing performed at the time of heating, and the sintering of a material which has a low diffusion coefficient and is thus not easily sintered can be facilitated. The density of the resulting sintered body can be improved as compared to conventional ones by sintering the above-described gallium nitride powder using such a sintering method.

The hot isostatic pressing method is a method in which a sample can be heated while applying thereto pressure isostatically. The hot isostatic pressing method has an effect of assisting substance diffusion during sintering in the same manner as the hot-pressing method and is characterized by being capable of yielding a high-density sintered body because sintering can be performed under a higher pressure than in the hot-pressing method.

In this embodiment, the sintering temperature is preferably 900° C. to 1050° C. in cases where a hot-pressing method is employed. The sintering temperature is also preferably not lower than 900° C. in order to facilitate the sintering of gallium nitride, and the sintering temperature is also preferably not higher than 1050° C. in order to prevent the decomposition of gallium nitride into nitrogen and metal gallium. It is also preferred that the pressure during sintering is controlled at not less than 10 MPa in order to improve the density of the resulting sintered body. It is also preferred that the pressure during sintering is not higher than 100 MPa from the standpoint of preventing damage of a carbon-made die commonly used in hot-pressing.

In cases where a hot-isostatic pressing method is employed, it is also preferred that the sintering temperature is 900° C. to 1050° C. in the same manner as in the case of hot-pressing method and the pressure during sintering is 10 MPa to 300 MPa. The pressure is also preferably not less than 10 MPa in order to improve the density of the resulting sintered body. Moreover, the sintered body also has preferably a large open porosity in order to obtain a gallium nitride sintered body having a low oxygen content by nitriding the interior of the sintered body in the subsequent nitridation step of the sintered body. The pressure during sintering is also preferably not higher than 300 MPa in order to obtain an open porosity of preferably not less than 70% by volume with respect to the total volume of the voids consisting of open pores and closed pores.

The thus obtained sintered body may also be processed into a prescribed dimension in accordance with the application thereof such as a sputtering target. The processing method is not particularly limited and, for example, a surface grinding method, a rotary grinding method, or a cylindrical grinding method can be employed.

In this embodiment, a gallium nitride sintered body produced by the above-described method contains gallium oxide; therefore, the sintered body is subjected to nitridation in order to nitride the gallium oxide contained therein. The nitridation of the sintered body can be performed by any arbitrary method capable of nitriding the gallium oxide contained in the sintered body. It is also preferred that the sintered body is heat-treated in an ammonia-containing atmosphere in order to ensure nitridation of the gallium oxide. An apparatus for performing the treatment in an ammonia atmosphere may either be a closed system or a flow system. The apparatus is also preferably a flow system from the standpoints of the safety and maintenance of reactivity. The amount of ammonia in the atmosphere appropriate for performing the treatment is variable depending on the mass of the loaded gallium nitride and the peak intensity ratio of gallium oxide to gallium nitride in the sintered body. It is sufficient as long as ammonia gas is flowed through in an amount comparable to the amount of the gallium nitride sintered body. It is also preferred that a larger amount of ammonia is flowed through, since the reactivity between ammonia and gallium oxide is further improved. In addition, the treatment temperature is also preferably in the range from 800° C., at which gallium oxide starts to be nitrided, to 1200° C. It is particularly preferred that the treatment temperature is 900° C. to 1200° C. from the standpoint of the reactivity between ammonia and gallium oxide. Gallium oxide existing in gallium nitride can be nitrided and a sintered body having a single gallium nitride phase can be obtained by controlling the treatment temperature in the above-described range.

The sintered body prior to being subjected to the nitridation treatment has density of preferably less than 5.0 g/cm³, more preferably less than 4.5 g/cm³, in order to achieve nitridation of the entire sintered body including the interior thereof.

The sintered body prior to being subjected to the nitridation treatment has an open porosity of also preferably not less than 70% by volume, more preferably not less than 90% by volume with respect to the total volume of the voids. In a reduction treatment of the sintered body which is performed using a reducing substance such as ammonia, the reducing substance permeates through the open pores; therefore, the more open pores exist in the sintered body, the more easily the entire sintered body is reduced. In addition, at the time of nitriding gallium oxide, distortion due to changes in the volume and the crystal of the gallium oxide caused by the nitridation can be absorbed by the open pores of the sintered body.

A second embodiment of the present invention is directed to a metal gallium-impregnated gallium nitride molded article which is characterized by comprising gallium nitride and metal gallium as separate phases and having a molar ratio, Ga/(Ga+N), of 55% to 80% in the entirety of the molded article. The molar ratio, Ga/(Ga+N), is a value which represents the molar ratio of Ga and (Ga+N) in terms of percentage.

The structure of the metal gallium-impregnated gallium nitride molded article according to this embodiment is described hereinafter referring to FIG. 3. In this embodiment, the term "molded article" encompasses molded products that are obtained by hardening powder by a variety of methods such as a molding and a sintering. In cases where the metal gallium-impregnated gallium nitride molded article is used as a sputtering target, it is also preferred that the molded article contains a sintered body having prescribed density, since the stronger the target is, the less likely cracking occurs in the target during use; however, any molded article having prescribed density as a whole may be used.

A metal gallium-impregnated gallium nitride molded article 11 shown in FIG. 3 is characterized by comprising a gallium nitride phase 12 and a metal gallium phase 13 as separate phases and having a molar ratio, Ga/(Ga+N), of 55% to 80% in the entirety of the molded article. The existence of the gallium nitride and the metal gallium in the molded article as separate phases can be confirmed by identifying the structure by a X-ray diffraction analysis. It can also be confirmed whether the analyzed spot is of a single gallium phase or a phase containing nitrogen and gallium by using an analytical method such as an EPMA (electron probe microanalyzer) or an EDS (energy dispersive X-ray diffraction spectrometer). The metal gallium can also be detected and quantified by separating the metal gallium by, for example, heat-treating the molded article at about 150° C. to 250° C. to allow the metal gallium to be melted and exuded from the molded article.

The molar ratio of Ga/(Ga+N) in the entirety of the molded article can be determined by performing, for example, an elementary analysis using an EPMA, an XPS (X-ray photoelectron spectrometer) or the like. Alternatively, the molar ratio of Ga/(Ga+N) can be determined by, for example, thermally decomposing the gallium nitride molded article to measure the amount of nitrogen by thermal conductivity method (using, for example, an oxygen-nitrogen analyzer manufactured by LECO Corporation) and then measuring the gallium content in the molded article by performing an elementary analysis such as ICP emission spectroscopy.

In this embodiment, the thermal conductivity of the metal gallium-impregnated gallium nitride molded article can be improved by incorporating therein a prescribed amount of metal gallium. The molar ratio of Ga/(Ga+N) is also preferably not lower than 55% in order to attain a desired effect of improving the electrical conductivity of the metal gallium-impregnated gallium nitride molded article. Further, in cases where the metal gallium-impregnated gallium nitride molded article is used as a sputtering target, the molar ratio of Ga/(Ga+N) is also preferably not higher than 80% in order to achieve stable film formation. The metal gallium may be melted and markedly exuded from the target surface to affect the film formation when the ratio of metal gallium is excessively high. More preferably, the molar ratio of Ga/(Ga+N) is 60% to 80% in order to attain more stable electrical conductivity and thermal conductivity.

In this embodiment, it is also preferred that not less than 30% by volume of the total volume of the voids contained in the metal gallium-impregnated gallium nitride molded article is filled with the metal gallium. The term "void" used herein refers to a pore contained in the above-described molded article and the pore may be open or closed.

The amount of the metal gallium impregnated into the metal gallium-impregnated gallium nitride molded article is determined by, for example, performing a mapping analysis for gallium and nitrogen that are contained in the molded article by using an EDS, an EPMA or the like. The metal gallium-impregnated gallium nitride molded article according to this embodiment contains the gallium nitride having a molar ratio (gallium:nitrogen) of about 50:50 and the metal gallium; therefore, by performing a mapping analysis, the amount of the part of the metal gallium (C) can be determined by the following formula, C=A−B, taking the part where nitrogen was detected excluding the background as gallium nitride (B) and the part where gallium was detected excluding the background as total gallium (A). A void (D) is a part where neither gallium nor nitrogen is detected or a part observed as a pore under a SEM (scanning electron microscope). The volume ratio of metal gallium (X) with respect to voids (D) is a value which is calculated using the following formula, X=(A−B)/(A−B+D), and indicated in percentage.

In the gallium nitride molded article according to this embodiment in which not less than 30% of the total volume of the voids is filled with the metal gallium, the metal gallium can exist continuously, since the metal gallium is likely to impregnate into the interior of the gallium nitride molded article. In this manner, since the metal gallium covers the surface layer of the gallium nitride even in fine pores, it becomes easier to prevent the oxidation of the surface layer of the gallium nitride. In addition, the density and the electrical conductivity of the molded article can be improved by allowing the metal gallium to continuously exist into the interior of the molded article, and stable electrical discharge is therefore likely to be generated when the molded article is used as a sputtering target for preparing a gallium nitride thin film.

The upper limit of the amount of the metal gallium contained in the voids of the metal gallium-impregnated gallium nitride molded article is not particularly restricted; however, it is also preferred that the volume of the metal gallium is not greater than 90% with respect to the total volume of the voids, since the metal gallium may protrude due to the difference in the thermal expansions between the metal gallium and the gallium nitride sintered body caused by a slight increase in the temperature of the whole target at the time of sputtering. In this manner, occurrence of a defect (pinhole) can be prevented in the resulting thin film and a high yield can be stably maintained.

In this embodiment, it is also preferred that the metal gallium-impregnated gallium nitride molded article has density of 3.20 g/cm$^3$ to less than 6.05 g/cm$^3$. Since the molded article contains voids that are open to the outside, the "density" of the metal gallium-impregnated gallium nitride molded article refers to the density calculated from the mass and the apparent volume which is estimated from the shape of the molded article. In cases where the metal gallium-impregnated gallium nitride molded article is used as a sputtering target, the metal gallium-impregnated gallium nitride molded article has density of preferably not less than 3.20 g/cm$^3$, more preferably not less than 4.00 g/cm$^3$, in order to prevent occurrence of an abnormal electrical discharge at the time of sputtering. Meanwhile, excessively high density may prevent the metal gallium from impregnating into the interior of the molded article, which may cause an abnormal electrical discharge. Preferably, the metal gallium-impregnated gallium nitride molded article has density of less than 6.05 g/cm$^3$ in order to obtain a molded article whose interior is impregnated with the metal gallium.

In this embodiment, it is also preferred that the metal gallium-impregnated gallium nitride molded article has resistance of not higher than 1 Ω·cm. An electrical discharge is hardly generated by DC sputtering and only RF sputtering can produce an electrical discharge when the resistance of a gallium nitride target is high; however, when the resistance is 1 Ω·cm or less, the film productivity is further improved and the production equipment becomes less expensive, since a film is easily formed by DC sputtering as well. It is more preferred that the metal gallium-impregnated gallium nitride molded article has resistance of not higher than 0.1 Ω·cm in order to allow an electrical discharge to be more stably generated.

In this embodiment, the metal gallium-impregnated gallium nitride molded article has higher thermal conductivity as compared to a gallium nitride molded article prior to being impregnated with metal gallium. The more the metal gallium is contained in the molded article, the higher becomes the thermal conductivity of the whole molded article, since the thermal conductivity of the gallium nitride is lower than that of the metal gallium. Since the metal gallium-impregnated gallium nitride molded article has high thermal conductivity, when it is used as a sputtering target, cracking caused by thermal stress is not likely to occur even when a high power is applied. Accordingly, a thin film produced by a sputtering method has a small number of defects such as pinhole and the target can be used for a prolonged period with good yield.

Since the gallium nitride molded article prior to being impregnated with metal gallium contains voids in a large volume, the thermal conductivity thereof is 3 W/mK or less; however, the metal gallium-impregnated gallium nitride molded article according to this embodiment can have thermal conductivity of 10 W/mK or higher.

In this embodiment, the amount of oxygen contained in the metal gallium-impregnated gallium nitride molded article is also preferably not higher than 11 atm %. The amount of oxygen contained in the molded article can be measured by, for example, an oxygen-nitrogen analyzer (manufactured by LECO Corporation). Alternatively, the amount of oxygen can also be calculated from the intensity ratio of the gallium oxide peak of the (002) plane to the gallium nitride peak of the (002) plane, which is determined by measuring the molded article by a powder X-ray diffraction. It was discovered that the oxygen content is 11 atom % or less when the peak intensity ratio is less than 3%, as a result of detailed examination of the relationship between the intensity ratio of the gallium oxide peak to the gallium nitride peak in the (002) plane and the oxygen content.

Next, a method of producing the metal gallium-impregnated gallium nitride molded article according to this embodiment will be described in detail.

First, a gallium nitride molded article is produced using a gallium nitride powder. It is also preferred that the gallium nitride powder to be used contains impurities in the smallest amount possible and has a purity of not less than 4 N. The method of making the gallium nitride molded article is not particularly limited, and a variety of methods such as a method of molding a powder, a method of sintering a molded product, a hot-pressing (HP) treatment method, and a hot isostatic pressing (HIP) treatment method can be employed. It is also preferred to employ a method by which a molded article having a size of not smaller than 100 mmϕ can be easily produced. It is also preferred to employ a method by which a molded article having a high strength can be produced, since the strength of the gallium nitride molded article affects the mechanical strength of the metal gallium-impregnated gallium nitride molded article produced therefrom.

It is also preferred that the gallium nitride molded article prior to being impregnated with metal gallium has density of 2.0 g/cm$^3$ to 5.0 g/cm$^3$. The gallium nitride molded article prior to being impregnated with the metal gallium has density of preferably not less than 2.0 g/cm$^3$, more preferably not less than 2.5 g/cm$^3$, still more preferably not less than 3.0 g/cm$^3$, in order to prevent the molded article from being cracked when impregnated with the metal gallium and to provide the resulting metal gallium-impregnated gallium nitride molded article with sufficient strength when used as a sputtering target. The gallium nitride molded article prior to being impregnated with metal gallium has density of preferably not higher than 5.0 g/cm$^3$, more preferably not higher than 4.5 g/cm$^3$ in order to obtain a molded article having desired resistivity by utilizing the pores that are open to the interior of the molded article to allow the metal gallium to exist continuously in the interior of the molded article.

In this embodiment, the gallium nitride molded article obtained in the above-described manner is impregnated with metal gallium. As a method of impregnating the metal gallium into the above-described gallium nitride molded article, for example, but not limited to, the below-described method is convenient and practical. The gallium nitride molded article prior to being impregnated with metal gallium may be in an arbitrary form by, for example, being processed into a variety of shapes or adhered to a backing plate. When such gallium nitride molded article is impregnated with the metal gallium, it is difficult to achieve impregnation by mere immersion of a gallium nitride in metal gallium solution, since the wettability between the gallium nitride and the metal gallium is not high.

The method of impregnating the metal gallium into a gallium nitride molded article will now be described referring to FIGS. 4 to 6. The impregnation method comprises the following steps: (1) the step of removing gas contained in a gallium nitride molded article (FIG. 4); (2) the step of packaging metal gallium along with the gallium nitride molded article under vacuum (FIG. 5); and (3) the step of impregnating the metal gallium in a liquid state into the gallium nitride molded article with application of a prescribed pressure (FIG. 6). The metal gallium can be uniformly impregnated into the gallium nitride molded article by going through these steps.

The lower the oxygen content in the metal gallium used as a starting material is, the better it is. This is because the oxygen content of the resulting metal gallium-impregnated gallium nitride molded article can be reduced as long as the oxygen content in the metal gallium is low even when a large amount of oxygen is contained in the gallium nitride molded article prior to being impregnated with metal gallium. The amount of oxygen in the metal gallium is preferably not higher than 1 atm %, more preferably not higher than 0.1 atm %. The metal gallium may also be melted at a temperature of not lower than its melting point in a vacuum oven and subjected to a degassing treatment in order to reduce the amount of oxygen in the metal gallium.

Further, each step will now be described in detail.

First, the step (1) is described. For a gallium nitride molded article 12 having voids 14 as shown in FIG. 4, gas contained in the voids 14 is removed by vacuuming so as to allow the metal gallium to impregnate into the interior. The vacuuming is performed to the molded article such that a residual gas pressure inside the molded article becomes preferably not higher than 10000 Pa, more preferably not higher than 1000 Pa, still more preferably not higher than 100 Pa, in order to allow the metal gallium to almost completely impregnate into the molded article.

Next, the step (2) is described. Vacuuming is performed in a state where the gallium nitride molded article 12 and the metal gallium 15 are enclosed in a vacuum packaging bag 16 as shown in FIG. 5. The metal gallium 15 may be in a solid state or a liquid state under vacuum condition. The position of the metal gallium 15 in the vacuum packaging bag 16 is not particularly restricted; however, it is also preferred that the metal gallium 15 is uniformly arranged in the periphery of the gallium nitride molded article 12 as much as possible. The amount of the metal gallium loaded into the vacuum packaging bag 16 is also preferably not less than 30% with respect to the volume of the voids in the gallium nitride molded article in order to allow the entire gallium nitride molded article 12 to be uniformly impregnated with the metal gallium. At a smaller amount, since the metal gallium becomes hard to impregnate into the interior of the gallium nitride molded article 12, a metal gallium-impregnated gallium nitride molded article having a uniform structure is difficult to be obtained.

The material of the vacuum packaging bag 16 is not particularly limited, and a commonly used bag, such as an aluminum-deposited bag, a nylon bag, or a polyethylene bag, may be employed.

Next, the step (3) is described. The metal gallium is allowed to impregnate into the gallium nitride molded article by externally applying pressure to the vacuum packaging bag 16 as shown in FIG. 6. In cases where the metal gallium is in a solid state, it may be made into a liquid in advance by a heat treatment or the like. There is no particular restriction on the method of applying pressure and, for example, a uniaxial pressing method, a cold isostatic pressing (CIP) method, or a hot isostatic pressing (HIP) method can be employed; however, it is also preferred to employ a method by which pressure is externally applied to the vacuum packaging bag 16 in an isotropic manner, since it is also preferred that the metal gallium is impregnated from various directions. It is required that the temperature at the time of applying pressure is controlled to be higher than the solidification temperature of the metal gallium. After the application of pressure, the resulting metal gallium-impregnated gallium nitride molded article is taken out of the vacuum packaging bag 16 and the metal gallium remaining in the periphery of the molded article is removed.

The thus obtained metal gallium-impregnated gallium nitride molded article may also be processed into a prescribed dimension in accordance with the application thereof such as a sputtering target. The processing method is not particularly limited and, for example, a surface grinding method, a rotary grinding method, or a cylindrical grinding method can be employed.

The obtained metal gallium-impregnated gallium nitride molded article may also be subjected to a heat treatment. The metal gallium may protrude from the molded article to the outside due to the difference in the thermal expansions of the gallium nitride and that of the metal gallium when the metal gallium-impregnated gallium nitride molded article is heated at the time of sputtering or the like. The protrusion of the metal gallium can be prevented when the molded article is heated at the time of sputtering or the like, by heat-treating the metal gallium-impregnated gallium nitride molded article at a prescribed temperature to allow the metal gallium to protrude and removing the protruded metal gallium in advance. In the heat treatment, it is also preferred that the amount of the metal gallium remaining in the molded article is not less than 30% by volume with respect to the total volume of the voids, since the electrical conductivity of the metal gallium-impregnated gallium nitride molded article may be reduced by excessive protrusion of the metal gallium.

A third embodiment of the present invention is a combination of the first and second embodiments.

That is, the third embodiment is a metal gallium-impregnated gallium nitride molded article which comprises a gallium nitride sintered body and metal gallium, wherein the gallium nitride sintered body has density of 2.5 g/cm$^3$ to less than 5.0 g/cm$^3$ and has a composition in which the intensity ratio of the gallium oxide peak to the gallium nitride peak in the (002) plane is less than 3%, which is determined by a powder X-ray diffraction analysis, and wherein the metal gallium-impregnated gallium nitride molded article comprises the gallium nitride and the metal gallium as separate phases and has a molar ratio, Ga/(Ga+N), of 55% to 80% in the entirety of the molded article.

The metal gallium-impregnated gallium nitride molded article according to the third embodiment of the present invention can be produced by using the gallium nitride sintered body of the first embodiment and applying the above-described production method of the second embodiment.

According to the third embodiment, a metal gallium-impregnated gallium nitride molded article which has properties of both the gallium nitride sintered body according to the first embodiment and the metal gallium-impregnated gallium nitride molded article according to the second embodiment can be obtained.

The gallium nitride sintered body or the metal gallium-impregnated gallium nitride molded article according to the first to the third embodiments may also be fixed (bonded) onto a flat or cylindrical support medium using an adhesive such as a solder material as required. The material of the support medium is not particularly limited as long as it has high thermal conductivity and a strength capable of supporting the molded article; however, the material is also preferably a metal such as Cu, SUS, or Ti, because of the high thermal conductivity and high strength thereof. As for the shape of the support medium, it is also preferred that a flat support medium be used for a flat-shaped sintered body or molded article and a cylindrical support medium be used for a cylindrically-shaped sintered body or molded article. The adhesive (bonding material) used for adhering the sintered body or molded article onto the support medium is not particularly limited as long as it has an adhesive strength sufficient for supporting the sintered body or molded article onto the support medium. An electroconductive resin, a tin-based solder material, or an indium-based solder material can be employed as such an adhesive. Thereamong, an indium solder having high electrical conductivity and thermal conductivity as well as a softness to be easily deformed is also preferably employed. This is because when the gallium nitride sintered body or molded article is used as a sputtering target, the target surface can be efficiently cooled by using such an indium solder to adhere the gallium nitride sintered body or molded article onto the support medium, and the indium solder can prevent cracking of the sintered body or molded article by absorbing a stress generated by the difference of the thermal expansions between the sintered body or molded article and the support medium.

In cases where an indium-based solder material is used, a barrier layer such as tungsten, which has low reactivity with gallium, may also be formed between the sintered body or molded article and the solder material in order to prevent a reaction between the metal gallium impregnated into the gallium nitride sintered body or molded article and the solder material. It is also preferred that such a barrier layer is formed uniformly over the entire interface between the sintered body or molded article and the solder material. The method of forming such a barrier layer is not particularly limited, and the barrier layer can be formed by, for example, sputtering, vapor deposition, or coating.

Effects of the Invention

According to the first embodiment of the present invention, a gallium nitride sintered body having a low oxygen content can be obtained.

According to the second embodiment of the present invention, a gallium nitride molded article having low resistivity and large thermal conductivity can be obtained.

EXAMPLES

The first embodiment of the present invention will now be described by way of examples thereof; however, this embodiment is not limited thereto.

(Density)
The density of a sintered body was measured in accordance with the method of measuring the bulk density prescribed in JIS R1634.
(Oxygen Content)
The oxygen content of a sintered body was measured using an oxygen/nitrogen analyzer (manufactured by LECO Corporation).
(Repose Angle)
The repose angle, which is a parameter of powder fluidity, was measured using a powder tester (Model PT-N, manufactured by Hosokawa Micron Group).
(Specific Surface Area)
The specific surface area of a powder was measured using Micromeritics Tristar (manufactured by Shimadzu Corporation).
(Untamped Bulk Density)
The untamped bulk density of a powder was measured in accordance with JIS Z2504.

First Embodiment—Example 1

A gallium nitride powder (100 g, purity of 4 N; manufactured by Kojundo Chemical Lab. Co., Ltd.) having a specific surface area (BET) of 14 $m^2/g$, untamped bulk density of 0.551 $g/cm^3$, and a repose angle of 39° was loaded in a 102 mmϕ carbon-made die to perform hot-pressing. The hot-pressing treatment was performed by heating the gallium nitride powder at a rate of 200° C./h to a final temperature of 1000° C., increasing the pressing pressure to 40 MPa when the temperature reaches 1000° C., and maintaining the temperature and pressure for 2 hours. After the 2 hours of retention time, the resultant was cooled to about 50° C. over a period of 5 hours and the die was taken out to remove a gallium nitride sintered body. The thus obtained gallium nitride sintered body had density of 2.75 $g/cm^3$, and the volume ratio of open pores with respect to the total volume of open pores and closed pores was 98%. The gallium nitride sintered body was then processed into a 76.2 mmϕ×2.0 mmt disk.

Figure 1:
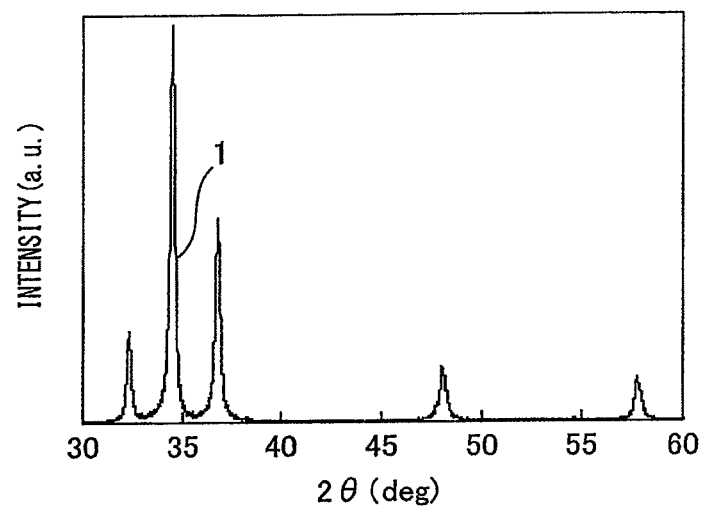
FIG. 1 shows an X-ray diffraction spectrum of the gallium nitride sintered body prepared in Example 1 of the first embodiment.

Then, 25.0 g of the thus processed gallium nitride sintered body was loaded in a tube furnace. The sintered body was heated to 1000° C. at a rate of 300° C./h and maintained at 1000° C. for 2 hours in an ammonia atmosphere in which ammonia gas was flowed through at 200 ml/min, to perform a nitridation treatment of the sintered body. The gallium nitride sintered body was analyzed by a powder X-ray diffraction (XRD; RINT Ultima III, manufactured by Rigaku Corporation) after the nitridation treatment to obtain the X-ray diffraction spectrum shown in FIG. 1. There was observed no peak corresponding to gallium oxide in the X-ray diffraction spectrum shown in FIG. 1; therefore, it was found that the thus obtained gallium nitride sintered body contained either no gallium oxide or only a trace amount of gallium oxide below the lower detection limit. The density, open porosity, oxygen content, and presence/absence of cracking of the obtained gallium nitride sintered body are shown in Table 2.

The obtained gallium nitride sintered body was bonded onto a backing plate made of Cu by using an indium solder as a bonding material to obtain a gallium nitride sputtering target.

First Embodiment—Example 2

The same gallium nitride powder as used in Example 1 (3 g, purity: 4 N) was loaded in a 20-mmϕ carbon-made die to perform hot-pressing. The hot-pressing treatment was performed by heating the gallium nitride powder at a rate of 200° C./h to a final temperature of 1000° C., increasing the pressing pressure to 100 MPa when the temperature reaches 1000° C., and maintaining the temperature and pressure for 2 hours. After the 2 hours of retention time, the resultant was cooled to about 50° C. over a period of 5 hours and the die was taken out to remove a gallium nitride sintered body. The gallium nitride sintered body was then processed into a 20.0 mmφ×2.0 mmt disk.

Then, 2.5 g of the thus processed gallium nitride sintered body was loaded in a tube furnace. The sintered body was heated to 900° C. at a rate of 300° C./h and maintained at 900° C. for 2 hours in an ammonia atmosphere in which ammonia gas was flowed through at 100 ml/min, to perform a nitridation treatment of the sintered body. The gallium nitride sintered body was analyzed by the XRD after the nitridation treatment, and there was observed no peak corresponding to gallium oxide in the X-ray diffraction spectrum; therefore, it was found that the thus obtained gallium nitride sintered body contained either no gallium oxide or only a trace amount of gallium oxide below the lower detection limit. The density, open porosity, X-ray peak intensity ratio, oxygen content, and presence/absence of cracking of the obtained gallium nitride sintered body are shown in Table 2.

First Embodiment—Example 3

A gallium oxide powder (200 g, purity: 4 N, manufactured by Nippon Rare Metal, Inc.) was loaded in a tube furnace. The gallium oxide powder was heated to 1050° C. at a rate of 600° C./h and maintained at 1050° C. for 5 hours to be nitrided in an ammonia atmosphere in which ammonia gas was flowed through at 400 ml/min, to obtain a gallium nitride powder. A portion of this gallium nitride powder was collected, and its specific surface area (BET), untamped bulk density, and repose angle were measured. The physical property values of the obtained gallium nitride powder are shown in Table 1.

Then, 100 g of the thus obtained gallium nitride powder was loaded in a 102 mmφ carbon-made die to perform a hot press. A hot-pressing treatment was performed by heating the gallium nitride powder at a rate of 200° C./h to a final temperature of 1050° C., increasing the pressing pressure to 50 MPa when the temperature reaches 1050° C., and maintaining the temperature and pressure for 2 hours. After the 2 hours of retention time, the resultant was cooled to about 50° C. over a period of 5 hours and the die was taken out to remove a gallium nitride sintered body. The obtained sintered body was then processed into a 76.2 mmφ×2 mmt disk.

Then, 28.0 g of the thus processed gallium nitride sintered body was loaded in a tube furnace. The sintered body was heated to 1050° C. at a rate of 300° C./h and maintained at 1050° C. for 2 hours in an ammonia atmosphere in which ammonia gas was flowed through at 200 ml/min, to perform a nitridation treatment of the sintered body.

The gallium nitride sintered body was analyzed by the XRD after the nitridation treatment, and there was observed no peak corresponding to gallium oxide in the X-ray diffraction spectrum; therefore, it was found that the thus obtained gallium nitride sintered body contained either no gallium oxide or only a trace amount of gallium oxide below the lower detection limit. The density, open porosity, X-ray peak intensity ratio, oxygen content, and presence/absence of cracking of the obtained gallium nitride sintered body are shown in Table 2.

The gallium nitride sintered body was bonded onto a backing plate made of Cu by using an indium solder as a bonding material to obtain a gallium nitride sputtering target having no breakage or cracking.

First Embodiment—Example 4

The same gallium oxide powder as used in Example 3 (200 g, purity: 4 N) was loaded in a tube furnace. The gallium oxide powder was heated to 1000° C. at a rate of 600° C./h and maintained at 1000° C. for 5 hours to be nitrided in an ammonia atmosphere in which ammonia gas was flowed through at 400 ml/min, to obtain a gallium nitride powder. A portion of this gallium nitride powder was collected, and its specific surface area (BET), untamped bulk density, and repose angle were measured.

The physical property values of the obtained gallium nitride powder are shown in Table 1.

After subjecting the thus obtained gallium nitride powder to a hot-pressing treatment under the same conditions as in Example 3, a nitridation treatment of the resulting gallium nitride sintered body was performed under the same conditions as in Example 3. The density, open porosity, X-ray peak intensity ratio, oxygen content, and presence/absence of cracking of the obtained gallium nitride sintered body are shown in Table 2.

First Embodiment—Example 5

The same gallium oxide powder as used in Example 3 (200 g, purity: 4 N) was loaded in a tube furnace. The gallium oxide powder was heated to 1,100° C. at a rate of 600° C./h and maintained at 1,100° C. for 5 hours to be nitrided in an ammonia atmosphere in which ammonia gas was flowed through at 400 ml/min, to obtain a gallium nitride powder. A portion of this gallium nitride powder was collected, and its specific surface area (BET), untamped bulk density, and repose angle were measured. The physical property values of the gallium nitride powder are shown in Table 1.

After subjecting the thus obtained gallium nitride powder to a hot-pressing treatment under the same conditions as in Example 3, a nitridation treatment of the resulting gallium nitride sintered body was performed under the same conditions as in Example 3. The density, open porosity, X-ray peak intensity ratio, oxygen content, and presence/absence of cracking of the obtained gallium nitride sintered body are shown in Table 2.

First Embodiment—Example 6

A gallium nitride powder in an amount of 100 g, which was obtained in the same manner as in Example 3, was loaded in a 102 mmφ carbon-made die to perform hot-pressing. The hot-pressing treatment was performed by heating the gallium nitride powder at a rate of 200° C./h to a final temperature of 1050° C., increasing the pressing pressure to 100 MPa when the temperature reaches 1050° C., and maintaining the temperature and pressure for 2 hours. After the 2 hours of retention time, the resultant was cooled to about 50° C. over a period of 5 hours and the die was taken out to remove a gallium nitride sintered body. The obtained sintered body was then processed into a 76.2 mmφ×2 mmt disk.

Then, 37.8 g of the thus processed gallium nitride sintered body was loaded in a tube furnace. The sintered body was heated to 1,050° C. at a rate of 300° C./h and maintained at 1,050° C. for 2 hours in an ammonia atmosphere in which ammonia gas was flowed through at 200 ml/min, to perform a nitridation treatment of the sintered body. The gallium nitride sintered body was analyzed by the XRD after the nitridation treatment, and a peak corresponding to gallium oxide was not observed in the X-ray diffraction spectrum; therefore, it was found that the thus obtained gallium nitride sintered body contained either no gallium oxide or only a trace amount of gallium oxide below the lower detection limit. The density, open porosity, X-ray peak intensity ratio, oxygen content, and presence/absence of cracking of the obtained gallium nitride sintered body are shown in Table 2.

The gallium nitride sintered body was bonded onto a backing plate made of Cu by using an indium solder as a bonding material to obtain a gallium nitride sputtering target having no breakage or cracking.

First Embodiment—Example 7

A gallium nitride powder in an amount of 100 g, which was obtained in the same manner as in Example 3, was loaded in a 102 mmφ die made of SUS to perform a hot isostatic pressing. The hot isostatic pressing treatment was performed by heating the gallium nitride powder at a rate of 100° C./h to a final temperature of 1050° C., increasing the pressing pressure to 260 MPa when the temperature reaches 1050° C., and maintaining the temperature and pressure for 1 hour. After the 2 hours of retention time, the resultant was cooled to about 50° C. over a period of 8 hours and the die was taken out to remove a sintered body. The obtained sintered body was then processed into a 76.2 mmφ×2 mmt disk.

Then, 43.8 g of the thus processed gallium nitride sintered body was loaded in a tube furnace. The sintered body was heated to 1050° C. at a rate of 300° C./h and maintained at 1050° C. for 2 hours in an ammonia atmosphere in which ammonia gas was flowed through at 200 ml/min, to perform a nitridation treatment of the sintered body. The gallium nitride sintered body was analyzed by XRD after the nitridation treatment, and the intensity ratio of the gallium oxide peak to the gallium nitride peak in the (002) was determined to be 2.5% from the X-ray diffraction spectrum; therefore, it was found that the thus obtained gallium nitride sintered body contained only a minor amount of gallium oxide. The density, open porosity, X-ray peak intensity ratio, oxygen content, and presence/absence of cracking of the obtained sintered body are shown in Table 2.

The gallium nitride sintered body was bonded onto a backing plate made of Cu by using an indium solder as a bonding material to obtain a gallium nitride sputtering target having no breakage or cracking.

First Embodiment—Comparative Example 1

Figure 2:
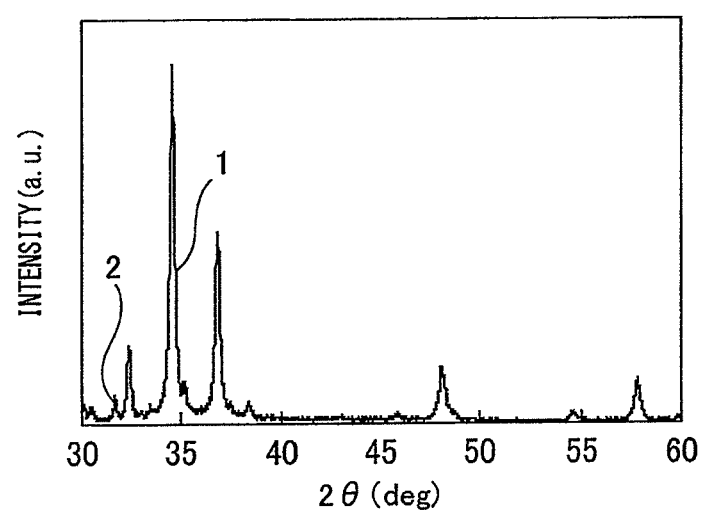
FIG. 2 shows an X-ray diffraction spectrum of the gallium nitride sintered body prepared in Comparative Example 1 of the first embodiment.
Figure 3:
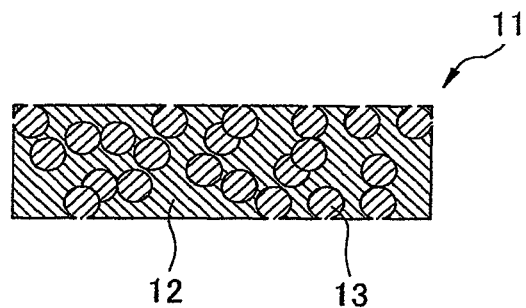
FIG. 3 is a schematic diagram showing a cross-section of a metal gallium-impregnated gallium nitride molded article according to the second embodiment.
Figure 4:
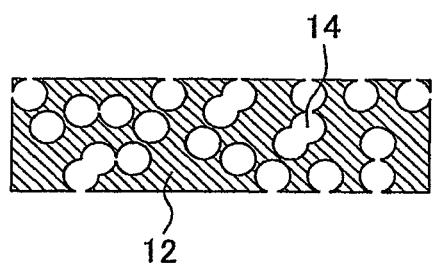
FIG. 4 is a schematic diagram showing a cross-section of a gallium nitride molded article from which gas was removed, in the second embodiment.
Figure 5:
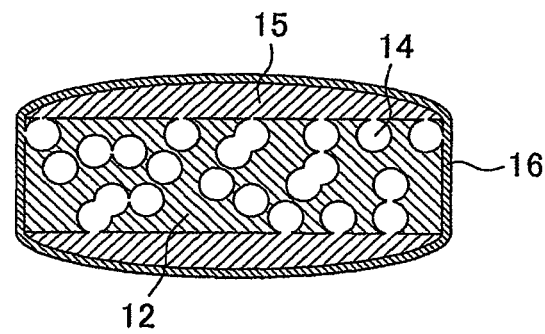
FIG. 5 is a schematic diagram showing a cross-section of a gallium nitride molded article and metal gallium that are packaged in a vacuum packaging container, in the second embodiment.
Figure 6:
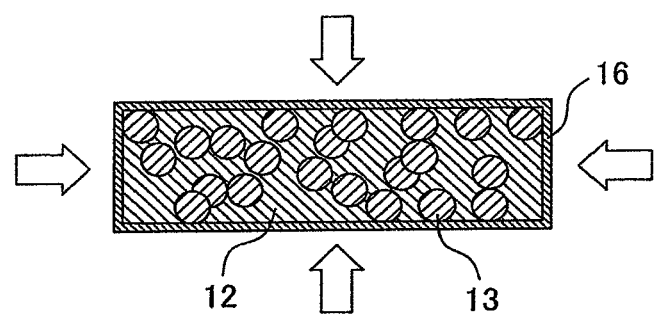
FIG. 6 is a schematic diagram showing a cross-section of a gallium nitride molded article impregnated with metal gallium under a prescribed pressure.

A gallium nitride sintered body was produced in the same manner as in Example 1 up to the point before the nitridation treatment. The obtained sintered body was analyzed by the XRD without performing a nitridation treatment, and the X-ray diffraction spectrum shown in FIG. 2 was obtained and the intensity ratio of the gallium oxide peak to the gallium nitride peak in the (002) plane was determined to be 5.9%; therefore, it was found that the obtained gallium nitride sintered body contained a large amount of gallium oxide.

First Embodiment—Comparative Example 2

A gallium nitride powder was obtained by subjecting a gallium oxide powder to a nitridation treatment in the same manner as in Example 3, except that the nitridation temperature was changed to 960° C. A portion of this gallium nitride powder was collected, and its specific surface area (BET) was measured. In addition, the untamped bulk density was measured in accordance with JIS Z2504, and the repose angle was also measured using a powder tester (Model PT-N, manufactured by Hosokawa Micron Group). The physical property values of the obtained gallium nitride powder are shown in Table 1.

The thus obtained gallium nitride powder was subjected to a hot-pressing, nitridation, and bonding in the same manner as in Example 3 to prepare a gallium nitride sintered body and a gallium nitride sputtering target. The resulting gallium nitride sintered body had a low strength, and cracking occurred when the sintered body was taken out of the carbon-made die used in the hot-pressing. The density, open porosity, X-ray peak intensity ratio, oxygen content, and presence/absence of cracking of the obtained sintered body are shown in Table 2.

First Embodiment—Comparative Example 3

A gallium nitride powder was obtained by subjecting a gallium oxide powder to a nitridation treatment in the same manner as in Example 3, except that the nitridation temperature was changed to 1120° C. A portion of the thus obtained gallium nitride powder was collected, and its specific surface area (BET) was measured. In addition, the untamped bulk density was measured in accordance with JIS Z2504, and the repose angle was also measured using a powder tester (Model PT-N, manufactured by Hosokawa Micron Group). The physical property values of the obtained gallium nitride powder are shown in Table 1.

The thus obtained gallium nitride powder was subjected to a hot-pressing, nitridation, and bonding in the same manner as in Example 3 to prepare a gallium nitride sintered body and a gallium nitride sputtering target. The thus obtained gallium nitride sintered body had a low strength, and cracking occurred when the sintered body was taken out of the carbon-made die used in the hot-pressing. The density, open porosity, X-ray peak intensity ratio, oxygen content, and presence/absence of cracking of the sintered body are shown in Table 2.

TABLE 1

| | | Nitridation temperature of gallium oxide powder (° C.) | Surface area (BET) (m$^2$/g) | Untamped bulk density (g/cm$^3$) | Repose angle (°) |
|---|---|---|---|---|---|
| First embodiment | Example 1 | — | 14 | 0.551 | 39 |
| | Example 2 | — | 14 | 0.551 | 39 |
| | Example 3 | 1050 | 6 | 0.438 | 37 |
| | Example 4 | 1000 | 8 | 0.410 | 38 |
| | Example 5 | 1100 | 0.8 | 0.800 | 28 |
| | Example 6 | 1050 | 6 | 0.438 | 37 |
| | Example 7 | 1050 | 6 | 0.438 | 37 |
| | Comparative Example 1 | — | 14 | 0.551 | 39 |
| | Comparative Example 2 | 960 | 12 | 0.380 | 41 |
| | Comparative Example 3 | 1120 | 0.3 | 1.000 | 25 |

TABLE 2

| | | Sintering method | Sintering temperature (° C.) | Pressure (MPa) | Sintered density (g/cm³) | Open porosity (%) | Nitridation temperature of sintered body (° C.) | X-ray intensity ratio (%) | Oxygen content (atm %) | Presence/absence of breakage/cracking |
|---|---|---|---|---|---|---|---|---|---|---|
| First Embodiment | Example 1 | HP | 1000 | 40 | 2.75 | 98 | 1000 | 0.0 | 4.5 | absent |
| | Example 2 | HP | 1000 | 100 | 4.05 | 88 | 900 | 0.0 | 4.9 | absent |
| | Example 3 | HP | 1050 | 50 | 3.04 | 76 | 1050 | 0.0 | 3.3 | absent |
| | Example 4 | HP | 1050 | 50 | 2.80 | 80 | 1050 | 0.0 | 3.8 | absent |
| | Example 5 | HP | 1050 | 50 | 3.35 | 72 | 1050 | 0.0 | 1.3 | absent |
| | Example 6 | HP | 1050 | 100 | 4.14 | 80 | 1050 | 0.0 | 5.1 | absent |
| | Example 7 | HIP | 1050 | 260 | 4.80 | 70 | 1050 | 2.5 | 9.6 | absent |
| | Comparative Example 1 | HP | 1000 | 40 | 2.70 | 98 | — | 5.9 | 15.2 | absent |
| | Comparative Example 2 | HP | 1050 | 50 | 2.43 | 90 | 1050 | 4.7 | 13.2 | present |
| | Comparative Example 3 | HP | 1050 | 50 | 4.26 | 60 | 1050 | 0.0 | 0.9 | present |

The second embodiment of the present invention will now be described by way of examples thereof; however, this embodiment is not limited thereto.

(Measurement of Repose Angle and Untamped Bulk Density of Gallium Nitride Powder)

The repose angle of a gallium nitride powder, which is a parameter of the fluidity, was measured using a powder tester (Model PT-N, manufactured by Hosokawa Micron Group). The untamped bulk density of a gallium nitride powder was measured in accordance with JIS Z2504.

The repose angle and untamped bulk density of the gallium nitride powders used in the respective examples are as shown below.

TABLE 3

| | | Bulk density (g/cm³) | Repose angle (°) |
|---|---|---|---|
| Second embodiment | Example 1 | 0.3 | 46 |
| | Example 2 | 1.2 | 34 |
| | Example 3 | 1.2 | 34 |
| | Example 4 | 1.2 | 34 |
| | Example 5 | 0.3 | 46 |
| | Example 6 | 0.3 | 46 |
| | Comparative Example 1 | 0.3 | 46 |
| | Comparative Example 2 | 0.3 | 46 |
| | Comparative Example 3 | 0.3 | 46 |

(Measurement of Density of Gallium Nitride Molded Article)

The density of a gallium nitride molded article obtained from the respective gallium nitride powders was calculated, based on its weight and the volume which is estimated from the apparent shape of the molded article.

(Measurement of Resistivity of Molded Article)

The resistivity of a molded article having low resistance was measured in accordance with a 4-probe method by use of Loresta HPMCP-T410 and that of a molded article having high resistance was measured by use of Hiresta MCP-T450.

The obtained metal gallium-impregnated gallium nitride molded article was bonded onto a backing plate made of Cu by using an In solder as a bonding material to obtain a gallium nitride-based sputtering target.

A film was formed by sputtering under the following film formation conditions by use of the obtained target, and the thus obtained film was evaluated:

Electric discharge method: RF sputtering or DC sputtering Film formation apparatus: Magnetron sputtering apparatus (manufactured by Tokuda Seisakusho Co., Ltd.; CFS-4ES for 76.2 mmφ or CFS-8EP for 127 mmφ)

Target size: 76.2 mmφ or 127 mmφ

Film formation pressure: 0.8 Pa

Added gas: Nitrogen

Electric discharge power: 100 W.

Second Embodiment—Example 1

A gallium nitride powder in an amount of 100 g (purity: 4 N, manufactured by Kojundo Chemical Lab. Co., Ltd.) was loaded in a 102 mmφ carbon-made die to perform hot-pressing. The hot-pressing treatment was performed by heating the gallium nitride powder at a rate of 200° C./h to a final temperature of 1000° C., increasing the pressing pressure to 40 MPa when the temperature reaches 1000° C., and maintaining the temperature and pressure for 2 hours. After the 2 hours of retention time, the resultant was cooled to about 50° C. over a period of 5 hours and the die was taken out to remove a gallium nitride sintered body. The thus obtained sintered body had a size of about 100 mmφ and density of 2.69 g/cm³. The sintered body was then processed into a 76.2 mmφ×2 mmt disk.

Then, 24.5 g of the thus processed gallium nitride sintered body and 33.0 g of metal gallium (purity: 6 N, oxygen content: 0.0174 atm %; manufactured by Dowa Electronics Materials CO., Ltd.) were placed in a vacuum packaging bag such that the metal gallium was arranged in the periphery of the gallium nitride sintered body. The vacuum packaging bag in which the gallium nitride sintered body and the metal gallium were placed was then vacuumed under reduced pressure of 1000 Pa to vacuum-package the gallium nitride sintered body along with the metal gallium. The thus packaged container was then heated to about 50° C. to completely melt the metal gallium and the resultant was then subjected to a cold isostatic pressing (CIP) at 100 MPa for 60 seconds to obtain a molded article. After removing the molded article from the CIP, the molded article was heated at about 50° C. to remove the metal gallium remaining in the periphery to obtain a metal gallium-impregnated gallium nitride molded article. The thus obtained metal gallium-impregnated gallium nitride molded article had density of 5.26 g/cm³ and resistance of $4.30 \times 10^{-3}$ Ω·cm.

Figure 7:
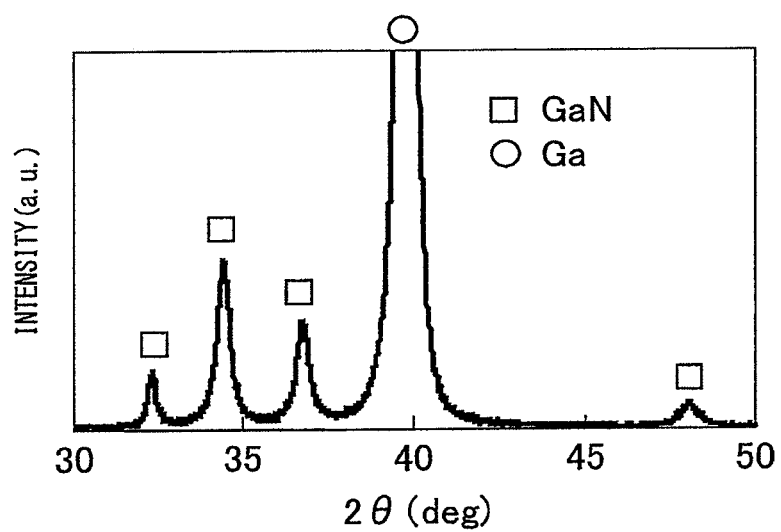
FIG. 7 shows a powder X-ray diffraction spectrum of the metal gallium-impregnated gallium nitride molded article obtained in Example 1 of the second embodiment.

The obtained molded article was mirror-polished to expose a cross-section and the distribution of gallium and nitrogen in the cross-section was examined using an electron probe microanalyzer (EPMA; EPMA1610, manufactured by Shimadzu Corporation), and there were confirmed spots where nitrogen and gallium were in coexistence and spots where nitrogen was not detected excluding the background and gallium was predominantly present. In addition, a scanning electron microscope (SEM; JSM-7600F, manufactured by JEOL Ltd.) observation was performed for the same cross-section of the molded article to verify the positions of voids in the cross-section, and it was confirmed that the value of Ga/(Ga+N) in the cross-section of the molded article was 69% in terms of molar ratio and that the volume ratio of metal gallium with respect to the volume of the voids in the gallium nitride sintered body was 78%. Moreover, the same cross-section of the molded article was analyzed by a powder X-ray diffraction (XRD; RINT Ultima III, manufactured by Rigaku Corporation), and it was confirmed that gallium nitride and metal gallium coexisted as shown in the X-ray diffraction spectrum shown in FIG. 7.

The thus obtained metal gallium-impregnated gallium nitride molded article was bonded onto a backing plate made of Cu by using an indium solder as a bonding material to obtain a gallium nitride-based sputtering target. Sputtering was then performed under the above-described film formation conditions by use of the obtained target, and a film having no cracking or the like was obtained by both RF sputtering and DC sputtering; therefore, it was confirmed that a film can be formed by both RF sputtering and DC sputtering by using the gallium nitride-based sputtering target of this Example. Further, the rate of film formation by DC sputtering was found to be 35 nm/min; therefore, it was confirmed that a film can be formed at a high rate.

Second Embodiment—Example 2

50 g of the same gallium nitride powder as used in Example 1 and 1000 g of iron-cored resin balls of 15 mm in diameter were loaded in a 1-L nylon pot. The loaded materials were dry-mixed for 20 hours using a rotary ball mill, and the resin balls and coarse particles were then removed using a 500-μm sieve. Thereafter, the thus sieved powder was subjected to rolling granulation for 2 hours and the resultant was collected to obtain a gallium nitride granulated powder in an amount of about 50 g. A gallium nitride granulated powder was prepared twice by this method to obtain a total of 100 g of a gallium nitride granulated powder.

The entire amount of the obtained gallium nitride granulated powder was loaded in a 102 mmφ carbon-made die to perform hot-pressing. The hot-pressing treatment was performed by heating the gallium nitride granulated powder at a rate of 200° C./h to a final temperature of 1000° C., increasing the pressing pressure to 40 MPa when the temperature reaches 1000° C., and maintaining the temperature and pressure for 2 hours. After the 2 hours of retention time, the resultant was cooled to about 50° C. over a period of 5 hours and the die was taken out to remove a gallium nitride sintered body. The thus obtained sintered body had a size of about 100 mmφ and density of 3.16 g/cm³. The sintered body was then processed into a 76.2 mmφ×2 mmt disk.

Then, 28.8 g of the thus processed gallium nitride sintered body and 30 g of the same metal gallium as used in Example 1 were placed in a vacuum packaging bag such that the metal gallium was arranged in the periphery of the gallium nitride sintered body. The vacuum packaging bag in which the gallium nitride sintered body and the metal gallium were placed was then vacuumed under reduced pressure of 1000 Pa to vacuum-package the gallium nitride sintered body along with the metal gallium. The thus packaged container was then heated to about 50° C. to completely melt the metal gallium and the resultant was then subjected to a cold isostatic pressing (CIP) at 100 MPa for 60 seconds to obtain a molded article. After removing the molded article from CIP, the molded article was heated at about 50° C. to remove the metal gallium remaining in the periphery to obtain a metal gallium-impregnated gallium nitride molded article. The thus obtained metal gallium-impregnated gallium nitride molded article had density of 5.30 g/cm³ and resistance of $8.60 \times 10^{-2}$ Ω·cm.

The obtained molded article was mirror-polished to expose a cross-section and the distribution of gallium and nitrogen in the cross-section was examined using an EPMA, and, there were confirmed spots where nitrogen and gallium were in coexistence and spots where nitrogen was not detected excluding the background and gallium was predominantly present. In addition, a scanning electron microscopic image (SEM image) was examined for the same cross-section of the molded article to verify the positions of voids in the cross-section, and it was confirmed that the value of Ga/(Ga+N) in the cross-section of the molded article was 65% in terms of molar ratio and that the volume ratio of metal gallium with respect to the volume of the voids in the gallium nitride sintered body was 75%.

The thus obtained metal gallium-impregnated gallium nitride molded article was bonded onto a backing plate made of Cu by using an indium solder as a bonding material to obtain a gallium nitride-based sputtering target. Sputtering was then performed under the above-described film formation conditions by use of the obtained target, and a film having no particular cracking or the like was obtained by both RF sputtering and DC sputtering; therefore, it was confirmed that a film can be formed by both RF sputtering and DC sputtering by using the gallium nitride-based sputtering target of this Example. Further, the rate of film formation by DC sputtering was found to be 35 nm/min; therefore, it was confirmed that a film can be formed at a high rate.

Second Embodiment—Example 3

A total of 350 g of a gallium nitride granulated powder was prepared in the same manner as in Example 2 and the entire amount thereof was loaded in a 170-mmφ carbon-made die to perform hot-pressing. The hot-pressing treatment was performed by heating the gallium nitride granulated powder at a rate of 200° C./h to a final temperature of 1000° C., increasing the pressing pressure to 40 MPa when the temperature reaches 1000° C., and maintaining the temperature and pressure for 2 hours. After the 2 hours of retention time, the resultant was cooled to about 50° C. over a period of 5 hours and the die was taken out to remove a gallium nitride sintered body. The thus obtained sintered body had a size of about 170 mmφ and density of 3.09 g/cm³. The sintered body was then processed into a 127 mmφ×3 mmt disk.

Then, 117.5 g of the thus processed gallium nitride sintered body and 120 g of the same metal gallium as used in Example 1 were placed in a vacuum packaging bag such that the metal gallium was arranged in the periphery of the gallium nitride sintered body. The vacuum packaging bag in which the gallium nitride sintered body and the metal gallium were placed was then vacuumed under reduced pressure of 10 Pa to vacuum-package the gallium nitride sintered body along with the metal gallium. The thus packaged container was then heated to about 50° C. to completely melt the metal gallium and the resultant was then subjected to a cold isostatic pressing (CIP) at 100 MPa for 60 seconds to obtain a molded article. After removing the molded article from CIP, the molded article was heated at about 50° C. to remove the metal gallium remaining in the periphery to obtain a metal gallium-impregnated gallium nitride molded article. The thus obtained metal gallium-impregnated gallium nitride molded article had density of 5.23 g/cm$^3$ and resistance of 6.20×10$^{-3}$ Ω·cm.

The obtained molded article was mirror-polished to expose a cross-section and the distribution of gallium and nitrogen in the cross-section was examined using an EPMA, and there were confirmed spots where nitrogen and gallium were in coexistence and spots where nitrogen was not detected excluding the background and gallium was predominantly present. In addition, a SEM observation was performed for the same cross-section of the molded article to verify the positions of voids in the cross-section, and it was confirmed that the value of Ga/(Ga+N) in the cross-section of the molded article was 65% in terms of molar ratio and that the volume ratio of metal gallium with respect to the volume of the voids in the gallium nitride sintered body was 73%.

The thus obtained metal gallium-impregnated gallium nitride molded article was bonded onto a backing plate made of Cu by using an indium solder as a bonding material to obtain a gallium nitride-based sputtering target. Sputtering was then performed under the above-described film formation conditions by use of the obtained target, and a film having no particular cracking or the like was obtained by both RF sputtering and DC sputtering; therefore, it was confirmed that a film can be formed by both RF sputtering and DC sputtering by using the gallium nitride-based sputtering target of this Example, and that a large-sized sputtering target can be produced.

Second Embodiment—Example 4

A gallium nitride sintered body was prepared and processed in the same manner as in Example 2 to obtain a sintered body in the form of a 76.2 mmφ×2 mmt disk. The obtained sintered body had density of 3.10 g/cm$^3$.

Then, 29 g of the thus processed gallium nitride sintered body and 30 g of the same metal gallium as used in Example 1 were placed in a vacuum packaging bag such that the metal gallium was arranged in the periphery of the gallium nitride sintered body. The vacuum packaging bag in which the gallium nitride sintered body and the metal gallium were placed was then vacuumed under reduced pressure of 1000 Pa to vacuum-package the gallium nitride sintered body along with the metal gallium. The thus packaged container was then heated to about 50° C. to completely melt the metal gallium and the resultant was then subjected to the CIP at 100 MPa for 60 seconds to obtain a molded article. After removing the molded article from the CIP, the molded article was heated at about 50° C. to remove the metal gallium remaining in the periphery to obtain a metal gallium-impregnated gallium nitride molded article. The thus obtained metal gallium-impregnated gallium nitride molded article was heat-treated in vacuum at 200° C. for 2 hours and then cooled to room temperature. The resulting metal gallium-impregnated gallium nitride molded article had density of 4.60 g/cm$^3$ and resistance of 5.1×10$^{-3}$ Ω·cm.

The obtained molded article was mirror-polished to expose a cross-section and the distribution of gallium and nitrogen in the cross-section was examined using an EPMA, and there were confirmed spots where nitrogen and gallium were in coexistence and spots where nitrogen was not detected excluding the background and gallium was predominantly present. In addition, a SEM observation was performed for the same cross-section of the molded article to verify the positions of voids in the cross-section, and it was confirmed that the value of Ga/(Ga+N) in the cross-section of the molded article was 62% in terms of molar ratio and that the volume ratio of metal gallium with respect to the volume of the voids in the gallium nitride sintered body was 51%.

The thus obtained metal gallium-impregnated gallium nitride sintered body was bonded onto a backing plate made of Cu by using an indium solder as a bonding material to obtain a gallium nitride-based sputtering target. Sputtering was then performed under the above-described film formation conditions by use of the obtained target, and a film having no particular cracking or the like was obtained by both RF sputtering and DC sputtering; therefore, it was confirmed that a film can be formed by both RF sputtering and DC sputtering by using the gallium nitride-based sputtering target of this Example.

Second Embodiment—Example 5

The same gallium nitride powder as used in Example 1 (100 g) was loaded in a 102-mmφ carbon-made die to be press-molded at room temperature with a pressure of 30 MPa. Thereafter, the resultant was subjected to a CIP treatment at 300 MPa to obtain a gallium nitride molded article having density of 2.19 g/cm$^3$. The obtained molded article was then processed into a 76.2 mmφ×2 mmt disk.

Then, 20.0 g of the thus processed gallium nitride molded article and 38 g of the same metal gallium as used in Example 1 were placed in a vacuum packaging bag such that the metal gallium was arranged in the periphery of the gallium nitride molded article. The vacuum packaging bag in which the gallium nitride molded article and the metal gallium were placed was then vacuumed under reduced pressure of 300 Pa to vacuum-package the gallium nitride molded article along with the metal gallium. The thus packaged container was then heated to about 50° C. to completely melt the metal gallium and the resultant was then subjected to a CIP treatment at 100 MPa for 60 seconds to obtain a molded article. After removing the molded article from the CIP, the molded article was heated at about 50° C. to remove the metal gallium remaining in the periphery to obtain a metal gallium-impregnated gallium nitride molded article. The thus obtained metal gallium-impregnated gallium nitride molded article had density of 5.48 g/cm$^3$ and resistance of 2.40×10$^{-3}$ Ω·cm.

The obtained molded article was mirror-polished to expose a cross-section and the distribution of gallium and nitrogen in the cross-section was examined using an EPMA, and there were confirmed spots where nitrogen and gallium were in coexistence and spots where nitrogen was not detected excluding the background and gallium was predominantly present. In addition, a SEM observation was performed for the same cross-section of the molded article to verify the positions of voids in the cross-section, and it was confirmed that the value of Ga/(Ga+N) in the cross-section of the molded article was 74% in terms of molar ratio and that the volume ratio of metal gallium with respect to the volume of the voids in the gallium nitride sintered body was 87%.

The thus obtained metal gallium-impregnated gallium nitride molded article was bonded onto a backing plate made of Cu by using an indium solder as a bonding material to obtain a gallium nitride-based sputtering target. Sputtering was then performed under the above-described film formation conditions by use of the obtained target, and a film having no particular cracking or the like was obtained by both RF sputtering and DC sputtering; therefore, it was confirmed that a film can be formed by both RF sputtering and DC sputtering by using the gallium nitride-based sputtering target of this Example.

Second Embodiment—Example 6

The same gallium nitride powder as used in Example 1 (100 g) was loaded in a 102 mmφ carbon-made die to perform hot-pressing. The hot-pressing treatment was performed by heating the gallium nitride powder at a rate of 200° C./h to a final temperature of 1050° C., increasing the pressing pressure to 50 MPa when the temperature reaches 1050° C., and maintaining the temperature and pressure for 2 hours. After the 2 hours of retention time, the resultant was cooled to about 50° C. over a period of 5 hours and the die was taken out to remove a gallium nitride sintered body. The thus obtained sintered body had density of 3.04 g/cm$^3$. The sintered body was then processed into a 76.2 mmφ×2 mmt disk.

Then, 27.7 g of the thus processed gallium nitride sintered body and 38 g of the same metal gallium as used in Example 1 were placed in a vacuum packaging bag such that the metal gallium was arranged in the periphery of the gallium nitride sintered body. The vacuum packaging bag in which the gallium nitride sintered body and the metal gallium were placed was then vacuumed under reduced pressure of 300 Pa to vacuum-package the gallium nitride sintered body along with the metal gallium. The thus packaged container was then heated to about 50° C. to completely melt the metal gallium and the resultant was then subjected to a CIP treatment at 100 MPa for 60 seconds to obtain a molded article. After removing the molded article from the CIP, the molded article was heated at about 50° C. to remove the metal gallium remaining in the periphery to obtain a metal gallium-impregnated gallium nitride molded article. The thus obtained metal gallium-impregnated gallium nitride molded article had density of 5.32 g/cm$^3$ and resistance of 1.80×10$^{-3}$ Ω·cm.

The obtained molded article was mirror-polished to expose a cross-section and the distribution of gallium and nitrogen in the cross-section was examined using an EPMA, and there were confirmed spots where nitrogen and gallium were in coexistence and spots where nitrogen was not detected excluding the background and gallium was predominantly present. In addition, a SEM observation was performed for the same cross-section of the molded article to verify the positions of voids in the cross-section, and it was confirmed that the value of Ga/(Ga+N) in the cross-section of the molded article was 72% in terms of molar ratio and that the volume ratio of metal gallium with respect to the volume of the voids in the gallium nitride sintered body was 81%.

A portion of the thus obtained metal gallium-impregnated gallium nitride molded article was collected and its oxygen content was measured using an oxygen-nitrogen analyzer (manufactured by LECO Corporation), and it was found that the metal gallium-impregnated gallium nitride molded article had an oxygen content of 6.03 atm %. In addition, the same cross-section of the molded article was analyzed by a powder X-ray diffraction (XRD; RINT Ultima III, manufactured by Rigaku Corporation), and the X-ray diffraction spectrum comparable to the one observed in Example 1 was obtained; therefore, it was confirmed that the gallium nitride and the metal gallium coexisted. Moreover, it was found that the obtained metal gallium-impregnated gallium nitride molded article contained either no gallium oxide or only a trace amount of gallium oxide below the lower detection limit, since there was no (002) peak of gallium oxide in the analyzed X-ray diffraction spectrum.

Furthermore, the metal gallium-impregnated gallium nitride molded article had thermal conductivity of 14.3 W/mK; therefore, it was confirmed that the thermal conductivity was improved as compared to the gallium nitride sintered body prior to being impregnated with metal gallium.

Then, RF sputtering was performed on a surface to be bonded (a surface to form an interface with a solder material) of the obtained metal gallium-impregnated gallium nitride molded article by using a tungsten target to form a barrier layer of tungsten. This film formation was carried out by a magnetron sputtering apparatus using the tungsten target of 76.2 mmφ in size, an added gas of argon, and an electrical discharge powder of 100 W. The thus obtained tungsten barrier layer had a thickness of 2 μm.

The thus obtained gallium-impregnated gallium nitride molded article having a barrier layer of tungsten formed thereon was bonded onto a backing plate made of Cu by using an indium solder as a bonding material to obtain a gallium nitride-based sputtering target. Sputtering was then performed under the above-described film formation conditions by use of the obtained target, and a film having no particular cracking or the like was obtained by both RF sputtering and DC sputtering; therefore, it was confirmed that a film can be formed by both RF sputtering and DC sputtering by using the gallium nitride-based sputtering target of this Example.

A portion of each of the metal gallium-impregnated gallium nitride molded articles obtained in Examples 1 to 5 was collected to measure the oxygen content and the thermal conductivity in the same procedures. The measurement results are shown in Table 7.

Second Embodiment—Comparative Example 1

The same gallium nitride powder as used in Example 1 (100 g) was loaded in a 102 mmφ carbon-made die to be press-molded at room temperature with a pressure of 30 MPa. Thereafter, the resultant was subjected to a CIP treatment at 300 MPa to obtain a gallium nitride molded article having density of 2.30 g/cm$^3$. The obtained molded article was then processed into a 76.2 mmφ×2 mmt disk. The molded article had resistance of 2.6×10$^7$ Ω·cm.

The obtained molded article was mirror-polished to expose a cross-section and the distribution of gallium and nitrogen in the cross-section was examined using an EPMA, and there were confirmed spots where nitrogen and gallium were in coexistence; however, a spot where nitrogen was not detected excluding the background and gallium was predominantly present was not observed. In addition, a SEM observation was performed for the same cross-section of the molded article to verify the positions of voids in the cross-section, and it was confirmed that the value of Ga/(Ga+N) in the cross-section of the molded article was 50% in terms of molar ratio and that the volume ratio of metal gallium with respect to the volume of the voids in the gallium nitride sintered body was 0%.

The thus obtained molded article was bonded onto a backing plate made of Cu by using an indium solder as a bonding material to obtain a gallium nitride-based sputtering target. When sputtering was performed using the obtained target under the same film formation conditions as in Example 1, cracking occurred in the target, and a film could not properly formed.

Second Embodiment—Comparative Example 2

A gallium nitride molded article was produced in the same manner as in Example 5. The obtained gallium nitride molded article had density of 2.20 g/cm$^3$.

Then, 20 g of the thus processed gallium nitride molded article and 4 g of the same metal gallium as used in Example 1 were placed in a vacuum packaging bag such that the metal gallium was arranged in the periphery of the gallium nitride molded article. The vacuum packaging bag in which the gallium nitride molded article and the metal gallium were placed was then vacuumed under reduced pressure of 1000 Pa to vacuum-package the gallium nitride molded article along with the metal gallium. The thus packaged container was then heated to about 50° C. to completely melt the metal gallium, and the resultant was then subjected to a CIP treatment at 100 MPa for 60 seconds to obtain a molded article. The thus obtained metal gallium-impregnated gallium nitride molded article had density of 2.58 g/cm$^3$ and resistance of $2.00 \times 10^2$ Ω·cm.

The obtained molded article was mirror-polished to expose a cross-section and the distribution of gallium and nitrogen in the cross-section was examined using an EPMA, and there were confirmed spots where nitrogen and gallium were in coexistence and spots where nitrogen was not detected excluding the background and gallium was predominantly present; however, the number of the spots where gallium was predominantly present was smaller as compared to Example 5. In addition, spots where metal gallium did not impregnate were also confirmed by visual observation of the molded article. Moreover, a SEM observation was performed for the same cross-section of the molded article to verify the positions of voids in the cross-section, and it was confirmed that the value of Ga/(Ga+N) in the cross-section of the molded article was 54% in terms of molar ratio and that the volume ratio of metal gallium with respect to the volume of the voids in the gallium nitride sintered body was 10%.

The thus obtained metal gallium-impregnated gallium nitride molded article was bonded onto a backing plate made of Cu by using an indium solder as a bonding material to obtain a gallium nitride-based sputtering target. Sputtering was then performed under the above-described film formation conditions by use of the obtained target. RF sputtering was able to be performed; however, DC sputtering could not be performed.

Second Embodiment—Comparative Example 3

The same gallium nitride powder as used in Example 1 (100 g) was sintered by a hot isostatic pressing method using a 102 mmφ die. The hot isostatic pressing treatment was performed by heating the gallium nitride powder at a rate of 100° C./h to a final temperature of 1050° C., increasing the pressing pressure to 280 MPa when the temperature reaches 1050° C., and maintaining the temperature and pressure for 2 hours. After the 2 hours of retention time, the resultant was cooled to about 50° C. over a period of 10 hours and the die was taken out to remove a gallium nitride sintered body. The thus obtained sintered body had density of 5.07 g/cm$^3$ and resistance of $1.2 \times 10^7$ Ω·cm. The sintered body was then processed into a 76.2 mmφ2 mmt disk.

Then, 46.2 g of the thus processed gallium nitride sintered body and 9 g of the same metal gallium as used in Example 1 were placed in a vacuum packaging bag such that the metal gallium was arranged in the periphery of the gallium nitride sintered body. The vacuum packaging bag in which the gallium nitride sintered body and the metal gallium were placed was then vacuumed under reduced pressure of 1000 Pa to vacuum-package the gallium nitride sintered body along with the metal gallium. The thus packaged container was heated to about 50° C. to completely melt the metal gallium and the resultant was then subjected to cold isostatic pressing (CIP) at 100 MPa for 60 seconds to obtain a molded article, in the same manner as in Example 1. The thus obtained metal gallium-impregnated gallium nitride molded article had density of 5.34 g/cm$^3$ and resistance of $2.13 \times 10^2$ Ω·cm. It is noted here that, although the amount of the metal gallium used was smaller than the weight of the processed gallium nitride sintered body, the amount of the metal gallium was sufficient for the volume of the voids calculated from the volume and density of the gallium nitride sintered body prior to being impregnated with the metal gallium, as in the metal gallium impregnation treatment performed in Examples 1 to 6.

The obtained molded article was mirror-polished to expose a cross-section and the distribution of gallium and nitrogen in the cross-section was examined using an EPMA, and there were confirmed spots where nitrogen and gallium were in coexistence and spots where nitrogen was not detected excluding the background and gallium was predominantly present; however, the number of the spots where gallium was predominantly present was smaller as compared to Example 1. In addition, spots where metal gallium did not impregnate were also confirmed by visual observation of the molded article. Moreover, it was confirmed that the value of Ga/(Ga+N) in the cross-section was 53% in terms of molar ratio and that the volume ratio of metal gallium with respect to the volume of the voids in the gallium nitride sintered body was 16%, by performing a SEM observation of the same cross-section of the molded article.

The thus obtained metal gallium-impregnated gallium nitride molded article was bonded onto a backing plate made of Cu by using an indium solder as a bonding material to obtain a gallium nitride-based sputtering target. Sputtering was then performed under the above-described film formation conditions by use of the obtained target. RF sputtering was able to be performed; however, DC sputtering could not be performed.

The processing conditions used in the respective Examples and Comparative Examples of the second embodiment are shown in Table 4.

TABLE 4

| | | Gallium nitride molding step | | | Metal gallium impregnation step | | | |
| --- | --- | --- | --- | --- | --- | --- | --- | --- |
| | | Molding method | Molding temperature (° C.) | Pressure (MPa) | Amount of gallium nitride sintered body (g) | Amount of metal gallium (g) | Vacuum pressure (Pa) | CIP Pressure (MPa) |
| Second Embodiment | Example 1 | HP | 1000 | 40 | 24.5 | 33 | 1000 | 100 |
| | Example 2 | HP | 1000 | 40 | 28.8 | 30 | 1000 | 100 |
| | Example 3 | HP | 1000 | 40 | 117.5 | 120 | 10 | 100 |
| | Example 4 | HP | 1000 | 40 | 29 | 30 | 1000 | 100 |
| | Example 5 | Uniaxial pressing | 25 | 30 | 20 | 38 | 300 | 100 |
| | Example 6 | HP | 1050 | 50 | 27.7 | 38 | 300 | 100 |
| | Comparative Example 1 | Uniaxial pressing | 25 | 30 | — | — | — | — |
| | Comparative Example 2 | Uniaxial pressing | 25 | 30 | 20 | 4 | 1000 | 100 |
| | Comparative Example 3 | HIP | 1050 | 280 | 46.2 | 9 | 1000 | 100 |

Table 5 shows the density of the respective gallium nitride molded articles as well as the density, Ga/(Ga+N) in terms of molar ratio (%), the volume ratio of metal gallium contained in the voids, and the resistivity of the respective metal gallium-impregnated gallium nitride molded articles obtained in Examples and Comparative Examples of the second embodiment.

TABLE 5

| | | Density of gallium nitride molded article (g/cm$^3$) | Density of metal gallium-impregnated gallium nitride molded article (g/cm$^3$) | Ga/(Ga + N) (%) | Ratio of metal gallium contained in voids (%) | Resistivity of metal gallium-impregnated gallium nitride molded article (Ω · cm) |
| --- | --- | --- | --- | --- | --- | --- |
| Second Embodiment | Example 1 | 2.69 | 5.26 | 69 | 78 | $4.30 \times 10^{-3}$ |
| | Example 2 | 3.16 | 5.30 | 65 | 75 | $8.60 \times 10^{-2}$ |
| | Example 3 | 3.09 | 5.23 | 65 | 73 | $6.20 \times 10^{-3}$ |
| | Example 4 | 3.10 | 4.60 | 62 | 51 | $5.10 \times 10^{-3}$ |
| | Example 5 | 2.19 | 5.48 | 74 | 87 | $2.40 \times 10^{-3}$ |
| | Example 6 | 3.04 | 5.32 | 72 | 81 | $1.80 \times 10^{-3}$ |
| | Comparative Example 1 | 2.30 | 2.30 | 50 | 0 | $2.60 \times 10^{7}$ |
| | Comparative Example 2 | 2.20 | 2.58 | 54 | 10 | $2.00 \times 10^{2}$ |
| | Comparative Example 3 | 5.07 | 5.34 | 53 | 16 | $2.13 \times 10^{2}$ |

Table 6 shows whether or not RF sputtering and DC sputtering could be carried out using the respective gallium nitride-based sputtering targets that were obtained in Examples and Comparative Examples of the second embodiment.

TABLE 6

| | | RF sputtering | DC sputtering |
| --- | --- | --- | --- |
| Second embodiment | Example 1 | Good | Good |
| | Example 2 | Good | Good |
| | Example 3 | Good | Good |
| | Example 4 | Good | Good |
| | Example 5 | Good | Good |
| | Example 6 | Good | Good |
| | Comparative Example 1 | No Good | No Good |

TABLE 6-continued

| | RF sputtering | DC sputtering |
| --- | --- | --- |
| Comparative Example 2 | Good | No Good |
| Comparative Example 3 | Good | No Good |

Table 7 shows the density of the respective gallium nitride molded articles as well as the density, the oxygen content, X-ray intensity ratio, and the thermal conductivity of the respective metal gallium-impregnated gallium nitride molded articles obtained in Examples and Comparative Examples of the second embodiment.

TABLE 7

|  |  | Density of gallium nitride molded article (g/cm³) | Density of metal gallium-impregnated gallium nitride molded article (g/cm³) | Oxygen content (atm %) | X-ray intensity ratio (%) | Thermal conductivity (W/mK) |
|---|---|---|---|---|---|---|
| Second embodiment | Example 1 | 2.69 | 5.26 | 8.39 | 0.0 | 13.9 |
|  | Example 2 | 3.16 | 5.30 | 10.5 | 2.5 | 13.5 |
|  | Example 3 | 3.09 | 5.23 | 8.74 | 0.0 | 12.2 |
|  | Example 4 | 3.10 | 4.60 | 9.22 | 0.7 | 11.5 |
|  | Example 5 | 2.19 | 5.48 | 7.81 | 0.0 | 14.7 |
|  | Example 6 | 3.04 | 5.48 | 6.03 | 0.0 | 14.3 |
|  | Comparative Example 1 | 2.30 | — | 16.1 | 8.5 | 2.6 |
|  | Comparative Example 2 | 2.20 | 2.58 | 12.5 | 3.4 | 2.8 |
|  | Comparative Example 3 | 5.07 | 5.34 | 13.3 | 4.1 | 2.7 |

DESCRIPTION OF SYMBOLS

1: Peak of the (002) plane of gallium nitride
2: Peak of the (002) plane of gallium oxide
11: Metal gallium-impregnated gallium nitride molded article
12: Gallium nitride phase
13: Metal gallium phase
14: Void
15: Metal gallium
16: Vacuum packaging bag

The invention claimed is:

1. A metal gallium-impregnated gallium nitride molded article, wherein
the molded article comprises
a gallium nitride phase having voids contained therein and a metal gallium phase
which exist as separate phases, and
the molded article has a molar ratio of Ga/(Ga+N) of 55% to 80%,
wherein said gallium nitride phase has a density of 2.5 g/cm³ to less than 5.0 g/cm³ and a composition having an intensity ratio of a gallium oxide peak of the (002) plane to a gallium nitride peak of the (002) plane of less than 3%, as determined by X-ray diffraction analysis.

2. The metal gallium-impregnated gallium nitride molded article according to claim 1, wherein not less than 30% of a total volume of said voids contained therein is filled with said metal gallium.

3. The metal gallium-impregnated gallium nitride molded article according to claim 1, wherein the molded article has density of 3.20 g/cm³ to less than 6.05 g/cm³.

4. The metal gallium-impregnated gallium nitride molded article according to claim 1, wherein the molded article has resistance of not higher than 1 Ω·cm.

5. The metal gallium-impregnated gallium nitride molded article according to claim 1, wherein the molded article contains oxygen in an amount of not more than 11 atm %.

6. The metal gallium-impregnated gallium nitride molded article according to claim 1, wherein
said voids contained therein comprise open pores and closed pores, and
the volume ratio of said open pores with respect to a total volume of said voids is not less than 70%.

7. A method of producing the metal gallium-impregnated gallium nitride molded article according to claim 1, wherein the method comprises impregnating a liquid metal gallium into a gallium nitride molded article having density of 2.0 g/cm³ to less than 5.0 g/cm³.

8. The method according to claim 7, wherein said impregnating the liquid metal gallium into a gallium nitride molded article includes
subjecting said gallium nitride molded article and said metal gallium to a vacuum treatment in the same container and then
isotropically applying a pressure to said container.

9. The method according to claim 7, wherein said gallium nitride molded article is obtained by a process comprising:
obtaining a molded article by sintering a gallium nitride powder having
a specific surface area (BET) of 0.4 m²/g to 15 m²/g,
untamped bulk density of not less than 0.4 g/cm³, and
a repose angle of not larger than 40°; and
heat-treating the obtained molded article in an ammonia-containing atmosphere.

10. The method according to claim 9, wherein said gallium nitride powder is obtained by subjecting a gallium oxide powder to a nitridation treatment in an ammonia atmosphere at a temperature of 1000° C. to 1100° C.

11. A gallium nitride sputtering target, comprising the metal gallium-impregnated gallium nitride molded article according to claim 1.

* * * * *